(12) United States Patent
Nakagawa et al.

(10) Patent No.: US 8,580,620 B2
(45) Date of Patent: Nov. 12, 2013

(54) METHOD OF MANUFACTURING SEMICONDUCTOR DEVICE

(75) Inventors: Kazuyuki Nakagawa, Kanagawa (JP); Shinji Baba, Kanagawa (JP); Satoshi Yamada, Kanagawa (JP); Takashi Karashima, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 445 days.

(21) Appl. No.: 12/853,817

(22) Filed: Aug. 10, 2010

(65) Prior Publication Data

US 2011/0039375 A1    Feb. 17, 2011

(30) Foreign Application Priority Data

Aug. 12, 2009   (JP) ................. 2009-187281

(51) Int. Cl.
  *H01L 21/00*   (2006.01)
(52) U.S. Cl.
  USPC .............. 438/121; 438/108; 257/E21.511
(58) Field of Classification Search
  USPC ............ 438/121, 106, 108, 109, 612, 614;
  257/737, 778, 738, 686, E21.511, 257/E21.509
  See application file for complete search history.

(56) References Cited

U.S. PATENT DOCUMENTS

2004/0235221 A1* 11/2004 Taguchi et al. ............ 438/108
2008/0258300 A1* 10/2008 Kobayashi et al. ........ 257/737

FOREIGN PATENT DOCUMENTS

JP       2002-26073       1/2002

* cited by examiner

*Primary Examiner* — Chuong A Luu
*Assistant Examiner* — Nga Doan
(74) *Attorney, Agent, or Firm* — McDermott Will & Emery LLP

(57) ABSTRACT

To aim at improvement of reliability of a semiconductor device of flip chip connection type. In assembling a BGA of flip chip connection type, when a semiconductor chip is solder-connected by a flip chip connection, because solder precoat is formed on the surface of a land on the side of an undersurface of a wiring substrate, the connection between the land and a solder ball, which is an external terminal, is solder-connection, and therefore, it is possible to increase impact resistance of a connection part between the land and the solder ball and to aim at improvement of reliability of the BGA.

12 Claims, 11 Drawing Sheets

S31
SOLDER PASTE PRINTING

⇩

S32
BALL ATTACHMENT

⇩

S33
REFLOW/CLEANING

METHOD OF MANUFACTURING SEMICONDUCTOR DEVICE

CROSS-REFERENCE TO RELATED APPLICATION

The disclosure of Japanese Patent Application No. 2009-187281 filed on Aug. 12, 2009 including the specification, drawings and abstract is incorporated herein by reference in its entirety.

BACKGROUND OF THE INVENTION

The present invention relates to manufacturing technology of a semiconductor device, in particular, to technology which is effective when applied to improve reliability of a semiconductor device in which a semiconductor chip is flip-chip connected to a wiring substrate.

In a ball grid array (BGA)-type semiconductor device, a structure and its assembly are disclosed, in which an electrode pad of a substrate includes copper (Cu) and the surface of Cu is plated with Ni and Au (for example, refer to Patent Document 1 (Japanese Patent Laid-Open No. 2002-26073)).

SUMMARY OF THE INVENTION

As an example of a multi-pin semiconductor package, a semiconductor device called a BGA is known. As a multi-pin high-heat dissipation package that increases the transfer rate of a signal in the BGA, a package is known, in which a semiconductor chip is mounted on a wiring substrate (also called a BGA substrate) by flip chip connection.

The inventors of the present invention have examined the surface treatment of a terminal (for example, an electrode pad of a land etc.) of a wiring substrate used in assembling a flip chip BGA and found the following problems as a result.

In the surface treatment of a terminal of a wiring substrate called a BGA substrate etc., electroless Ni—Au plating is used frequently in general. This is because a problem that arises when electrolytic plating is employed can be solved by employing electroless plating.

That is, for a wiring substrate having a number of pins and in which wirings are provided highly densely, such as a flip chip BGA, it is necessary to provide a plating lead when electrolytic plating is employed, and therefore such a problem is brought about that the degree of freedom in wiring design is reduced. Further, such a problem arises that the signal quality of a transfer path is deteriorated by the influence of the plating lead.

However, these problems are inherent in electrolytic plating and the plating lead for electrolytic plating can be obviated by employing electroless plating, and therefore, electroless plating is employed generally in many cases. That is, by performing electroless plating, the plating lead can be obviated, and therefore, it is possible to increase the degree of freedom in wiring design and to prevent deterioration in signal quality of a transfer path caused by the plating lead.

On the other hand, however, electroless Ni—Au plating is poor in impact resistance and as a result of that, has such a problem that the interface of a joint part between a land for mounting solder ball and a solder ball of a wiring substrate is destroyed (broken). It is thought that this occurs because P (phosphorus) is mixed in general when electroless Ni—Au plating is performed and micro voids are generated in a P-concentrated layer in electroless Ni—Au plating, and the occurrence of the voids makes the joint part vulnerable and deteriorates impact resistance.

Further, also in assembling the BGA type semiconductor device described in Patent Document 1 described above, Ni—Au plating is performed on the surface of the land (electrode pad) of the wiring substrate, and therefore, such a problem is brought about that the impact resistance of the joint part between the land and the solder ball is deteriorated.

The present invention has been made in view of the above-mentioned problems and an object thereof is to provide a technique capable of aiming at improvement of reliability of a semiconductor device in which a semiconductor chip is flip chip connected.

Another object of the present invention is to provide a technique capable of aiming at stabilization of quality of a semiconductor device in which a semiconductor chip is flip chip connected.

The other purposes and the new feature of the present invention will become clear from the description of the present specification and the accompanying drawings.

The following explains briefly the outline of a typical invention among the inventions disclosed in the present application.

That is, in the present invention: a semiconductor chip is connected facedown by solder connection on the side of a top surface of a wiring substrate having the top surface and an undersurface on the opposite side thereof; a solder ball connectable to a mounting substrate is provided on the side of the undersurface of the wiring substrate; a step of (a) connecting the semiconductor chip face-down by the solder connection to the top surface of the wiring substrate is included; and a solder precoat is formed on the surface of a land including copper as its main component on the side of the undersurface of the wiring substrate to which the solder ball is connected when the semiconductor chip is connected by the solder connection.

Further, in the present invention: a semiconductor chip is connected facedown by solder connection on the side of a top surface of a wiring substrate having the top surface and an undersurface on the opposite side thereof; a solder ball connectable to a mounting substrate is provided on the side of the undersurface of the wiring substrate; and the following steps are included: (a) arranging solder paste or solder balls respectively to a plurality of flip chip electrodes on the side of the top surface of the wiring substrate and further, applying solder paste to a plurality of lands on the side of the undersurface of the wiring substrate; (b) after the (a) step, melting the solder paste or the solder ball on the side of the top surface and the solder paste on the side of the undersurface by reflow to form solder precoat on each of the surfaces of the lands; (c) arranging a main surface of the semiconductor chip and the top surface of the wiring substrate facing each other; and (d) after the (c) step, heating the backside of the semiconductor chip by a first head member and further, heating the undersurface of the wiring substrate by a second head member to connect the semiconductor chip to the wiring substrate by the solder connection in a state where the solder precoat is formed at the surface of the lands on the side of the undersurface of the wiring substrate.

The following explains briefly the effect acquired by the typical invention among the inventions disclosed in the present application.

It is possible to improve impact resistance at a joint part between a land and a solder ball and to aim at improvement of reliability of a semiconductor device in assembling a semiconductor device of flip chip connection type.

Further, by using a ball mounting method at a bump connection part, it is possible to aim at stabilization of quality of a semiconductor device.

DETAILED DESCRIPTION OF PREFERRED EMBODIMENTS

In the following embodiments, explanation of the same or resembling part is not given in principle except when necessary in particular.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

In the following embodiments, as to an element A etc., it is needless to say the wording "comprising A", "having A", and "including A" does not exclude other elements except when explicitly stated in particular that only the element is included etc. Similarly, it is assumed that, in the following embodiments, when the shapes, positional relationships, etc., of the elements etc. are referred to, except when explicitly stated in particular or when they can apparently be thought otherwise in principle, those substantially similar to or resembling the shapes etc. are also included. This also applies to the above-mentioned numerical values and ranges.

Hereinafter, embodiments of the present invention will be described in detail based on the drawings. In all of the drawings for explaining embodiments, the same symbol is attached to the same member and the repeated explanation thereof is omitted.

Embodiment

Figure 1:
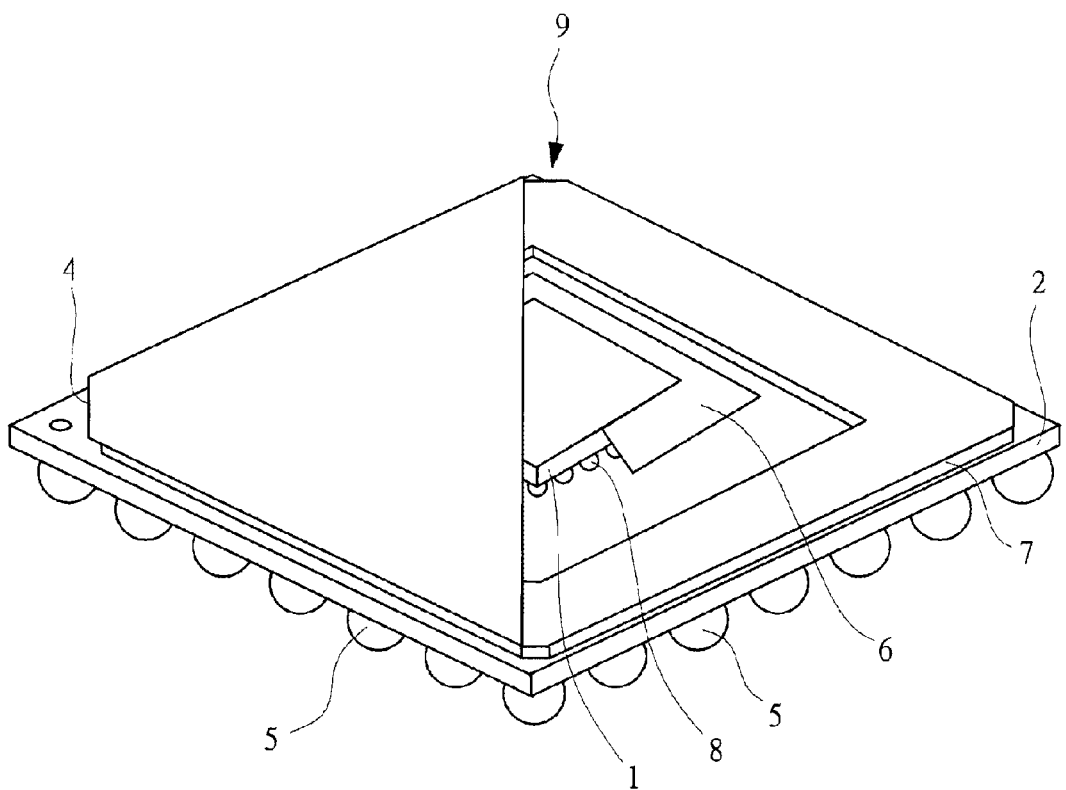
FIG. 1 is a perspective view, part of which is cut out, showing an example of a structure of a semiconductor device in an embodiment of the present invention.
Figure 2:
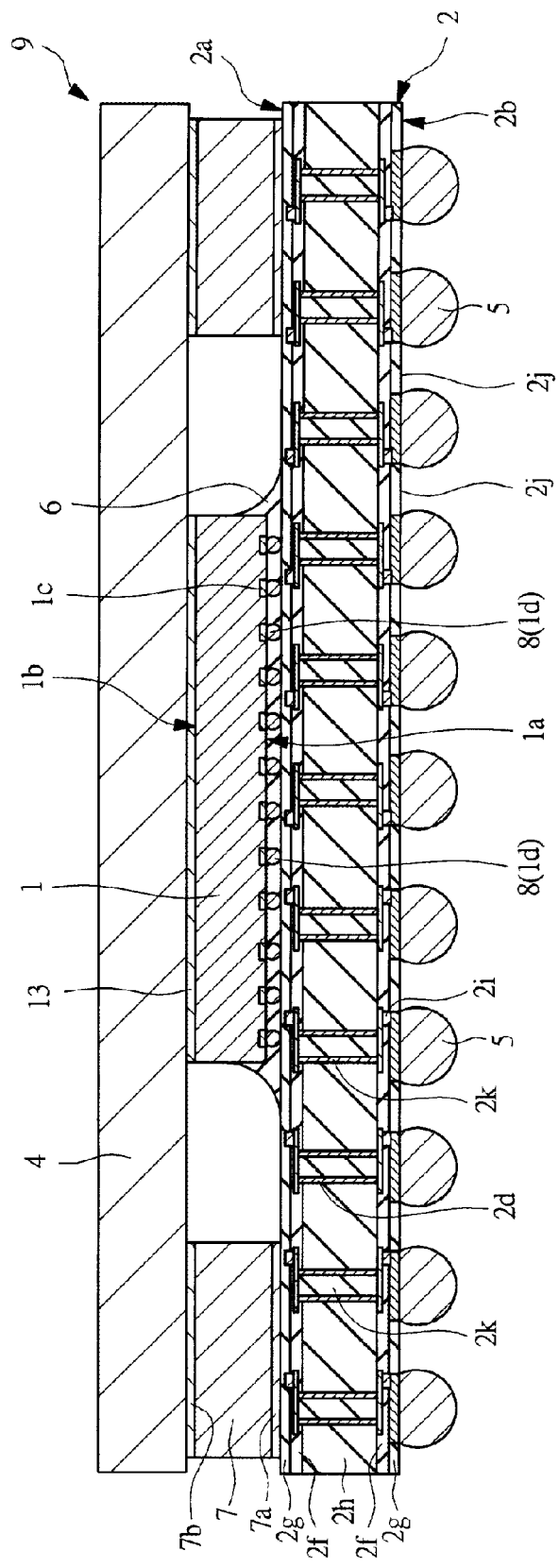
FIG. 2 is a section view showing an example of a structure of the semiconductor device shown in FIG. 1.
Figure 3:
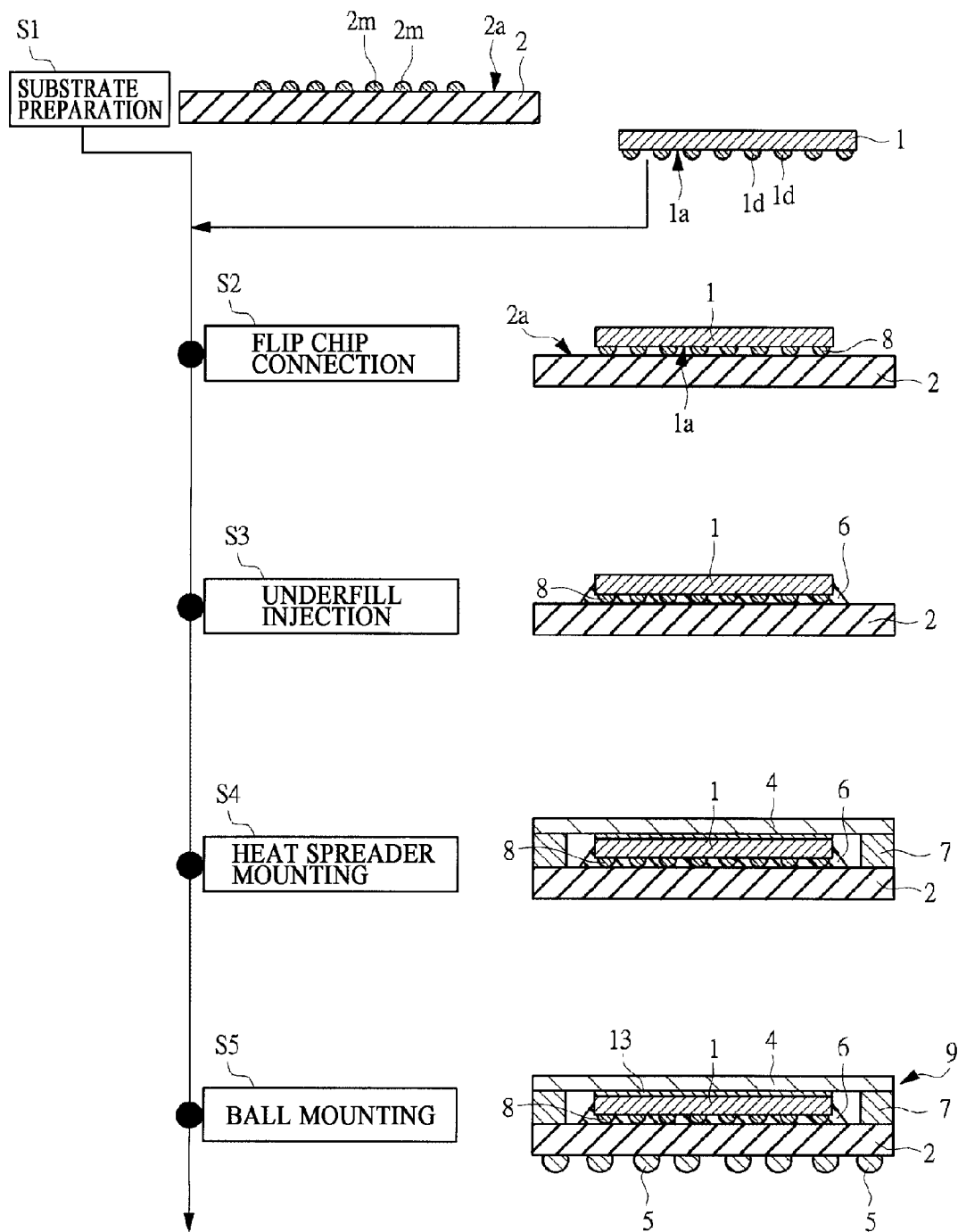
FIG. 3 is a manufacturing flowchart showing an example of a procedure of assembling the semiconductor device shown in FIG. 1.
Figure 4:
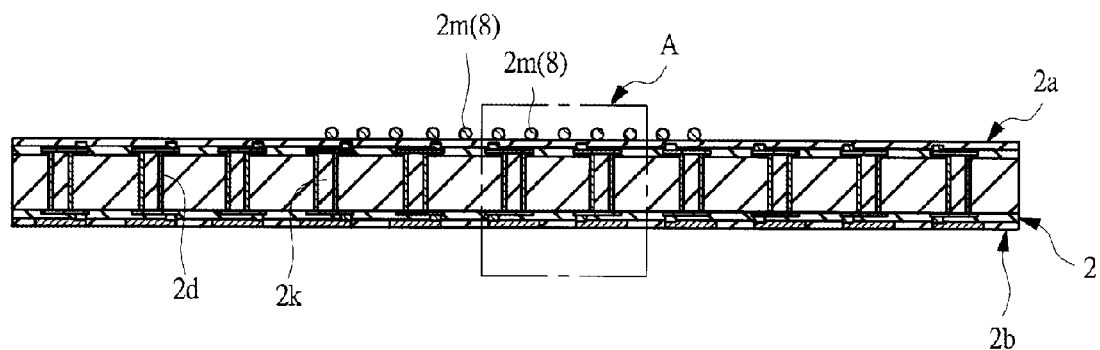
FIG. 4 is a section view showing an example of a structure of a wiring substrate used in assembling the semiconductor device shown in FIG. 1.
Figure 5:
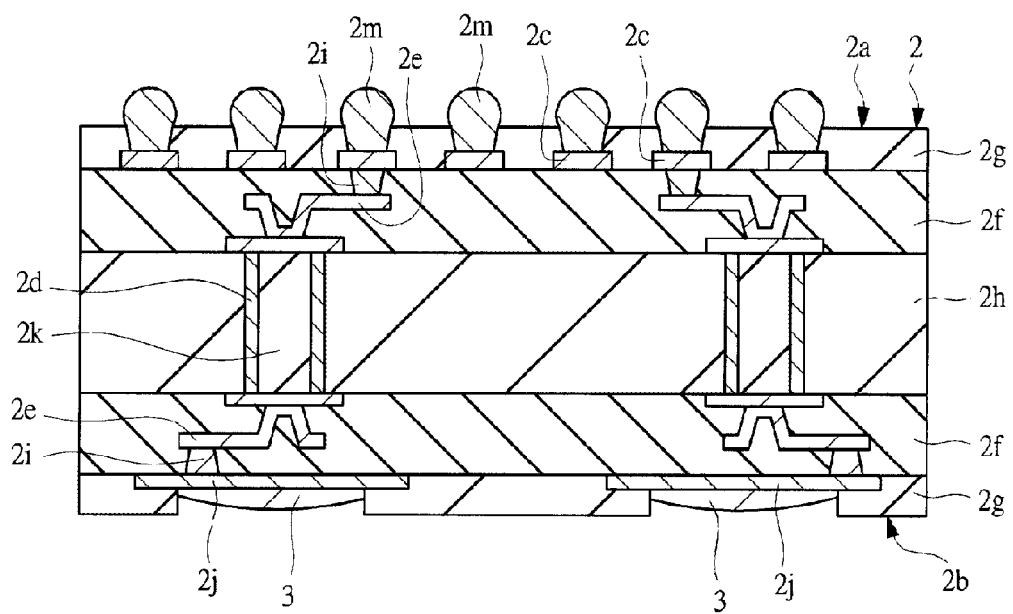
FIG. 5 is a partially enlarged section view showing an example of a structure of A part in FIG. 4.
Figure 6:
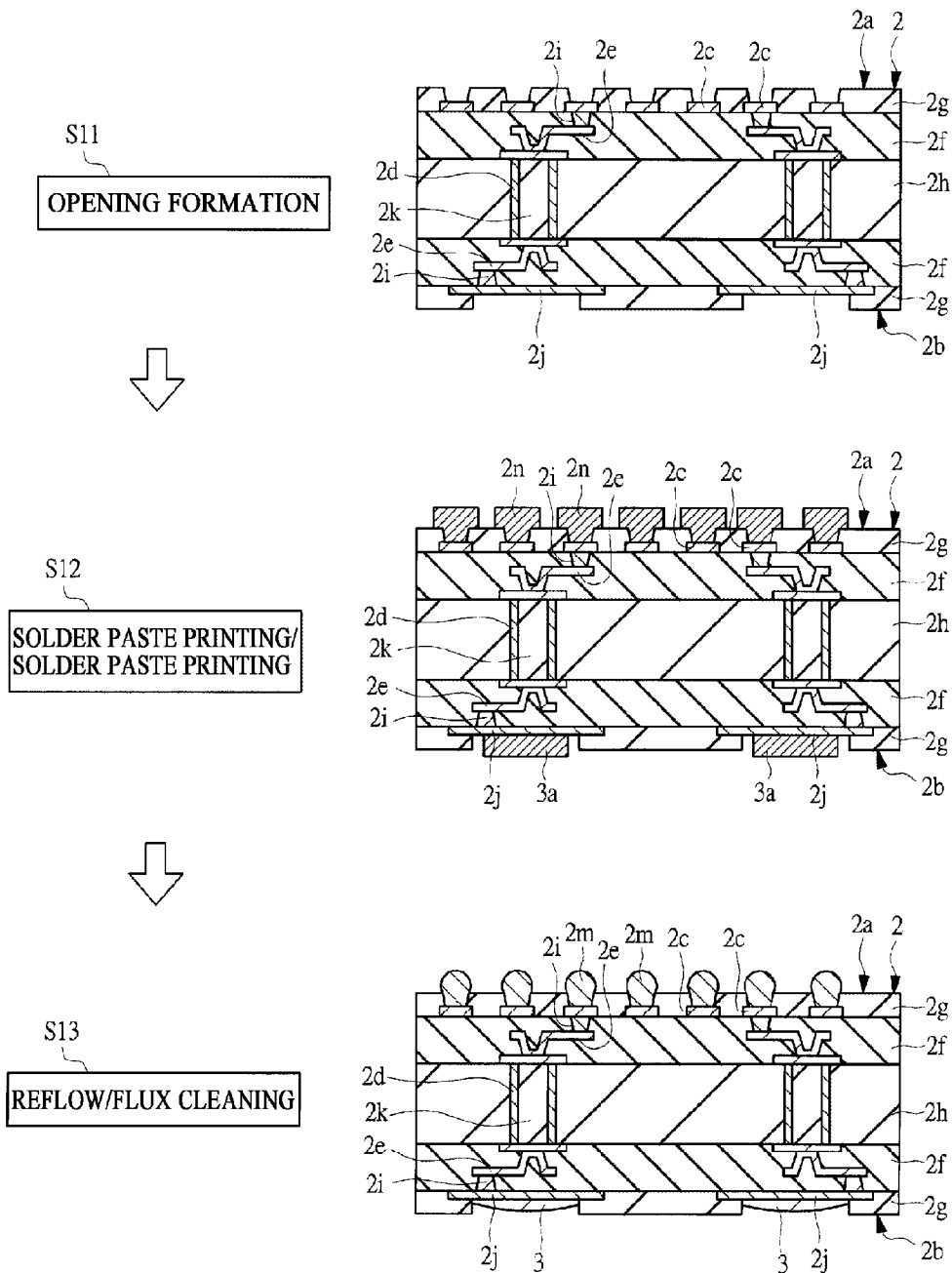
FIG. 6 is a partial section view showing an example of a forming method of a solder precoat of a wiring substrate used in assembling the semiconductor device shown in FIG. 1.
Figure 7:
FIG. 7 is a partial section view showing an example of details of a forming method of the solder precoat shown in FIG. 6.
Figure 7:
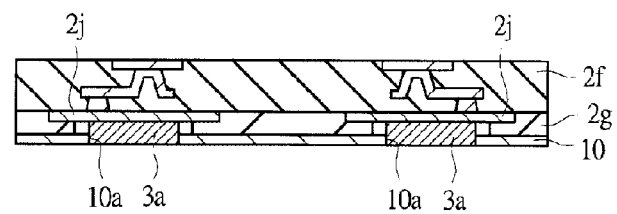
Figure 7:
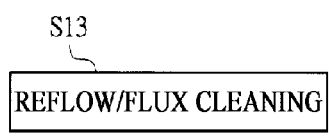
Figure 7:
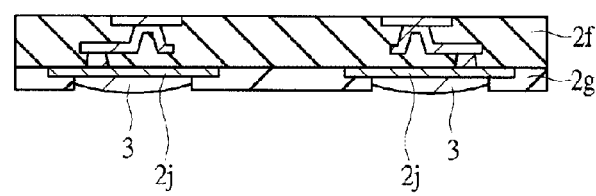
Figure 8:
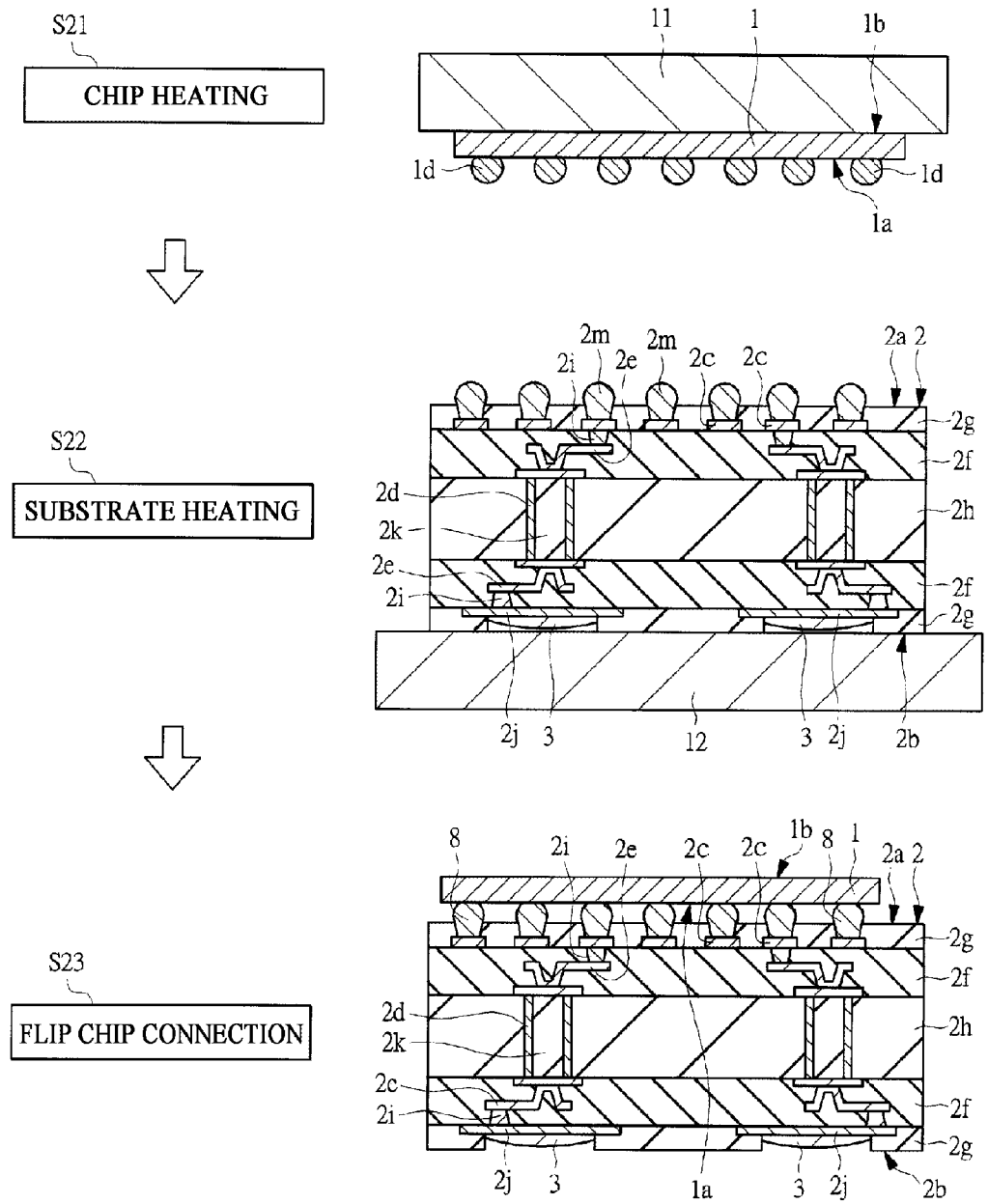
FIG. 8 is a partial section view showing an example of a procedure of flip chip connection in assembling the semiconductor device shown in FIG. 1.
Figure 9:
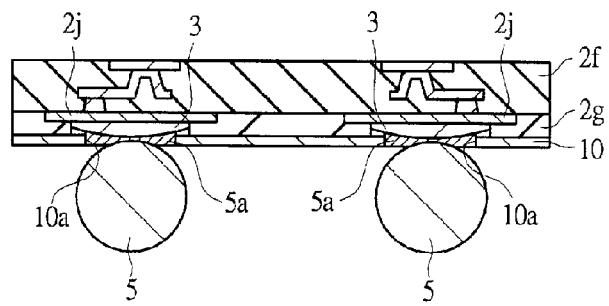
FIG. 9 is a partial section view showing an example of a procedure of ball mounting in assembling the semiconductor device shown in FIG. 1.
Figure 9:
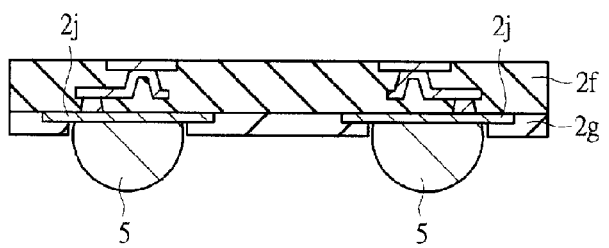
Figure 10:
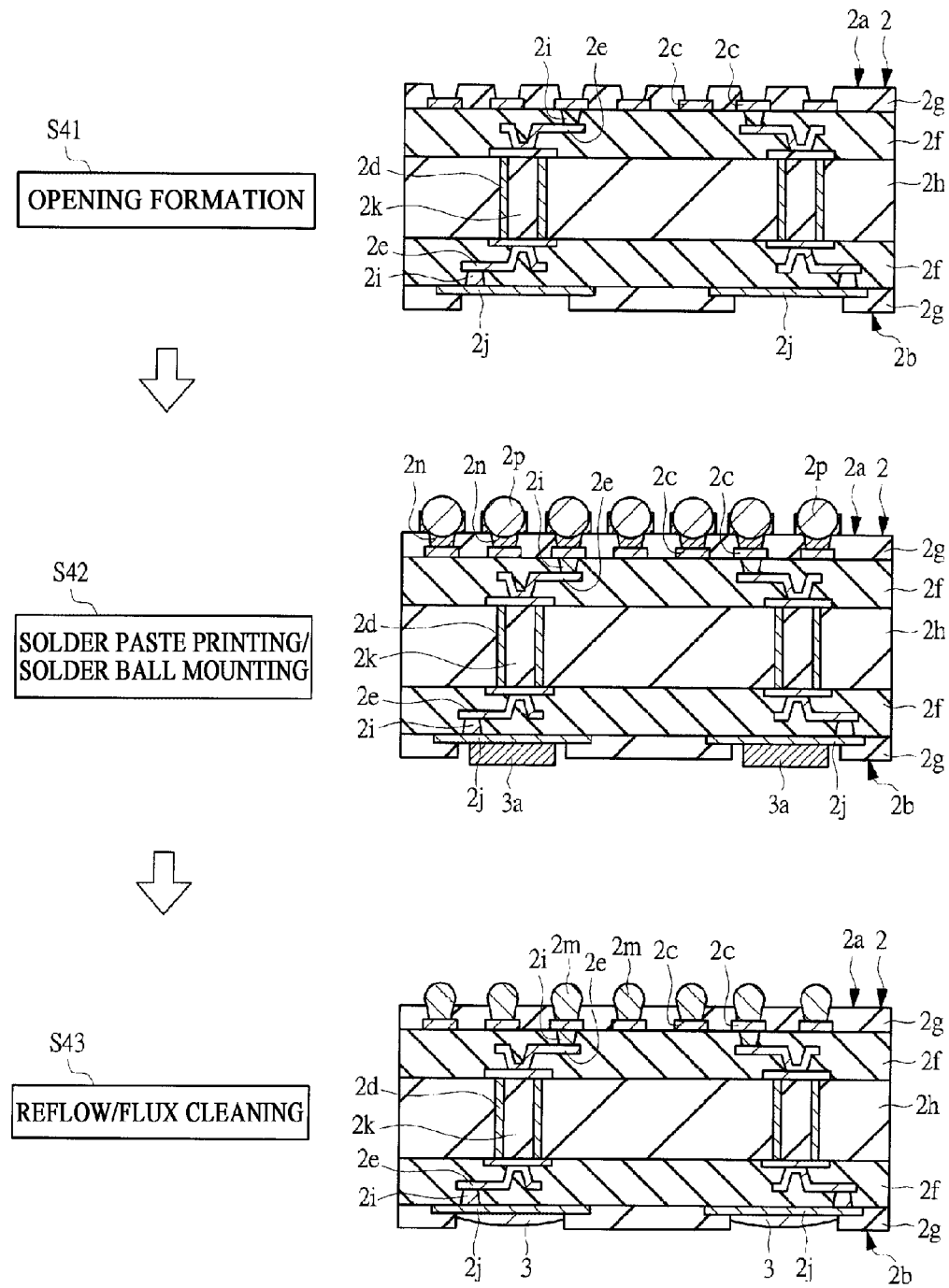
FIG. 10 is a partial section view showing a forming method of a solder precoat in a first modified example of a wiring substrate used in assembling the semiconductor device shown in FIG. 1.
Figure 11:
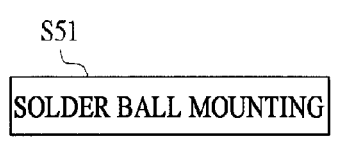
FIG. 11 is a partial section view showing a forming method of a solder precoat in a second modified example of a wiring substrate used in assembling the semiconductor device shown in FIG. 1.
Figure 11:
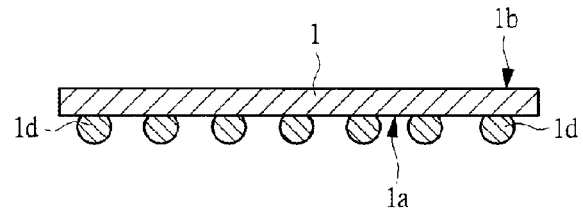
Figure 11:
Figure 11:
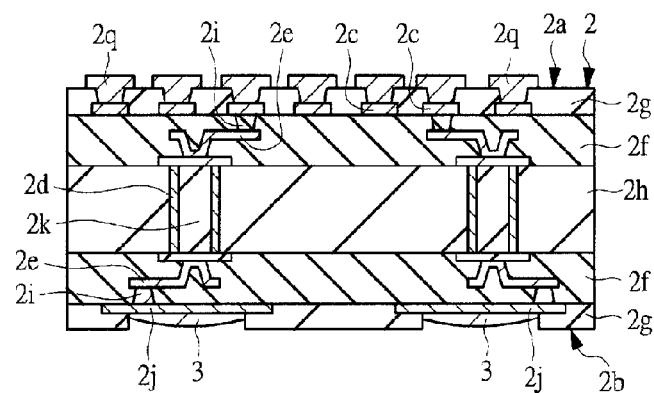
Figure 11:
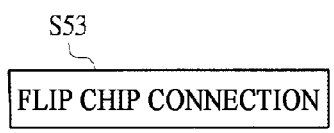
Figure 11:
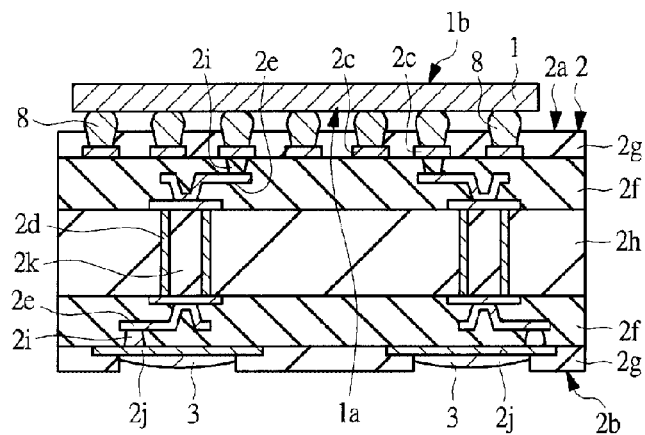
Figure 12:
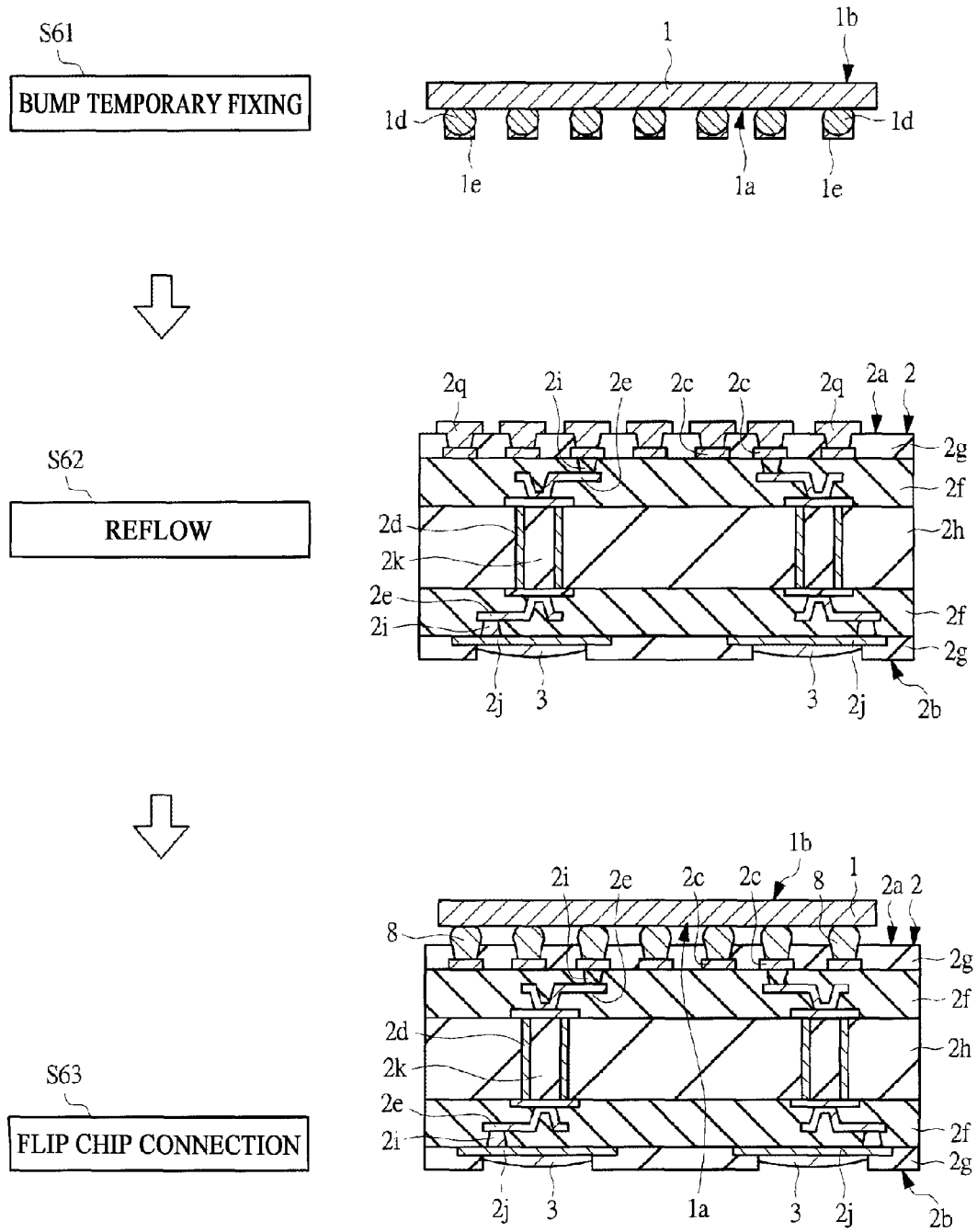
FIG. 12 is a partial section view showing a procedure of flip chip connection in a third modified example in assembling the semiconductor device shown in FIG. 1.

FIG. 1 is a perspective view, part of which is cut out, showing an example of a structure of a semiconductor device in an embodiment of the present invention, FIG. 2 is a section view showing an example of a structure of the semiconductor device shown in FIG. 1, and FIG. 3 is a manufacturing flowchart showing an example of a procedure of assembling the semiconductor device shown in FIG. 1. Further, FIG. 4 is a section view showing an example of a structure of a wiring substrate used in assembling the semiconductor device shown in FIG. 1, FIG. 5 is a partially enlarged section view showing an example of a structure of A part in FIG. 4, FIG. 6 is a partial section view showing an example of a forming method of a solder precoat of a wiring substrate used in assembling the semiconductor device shown in FIG. 1, and FIG. 7 is a partial section view showing an example of details of a forming method of the solder precoat shown in FIG. 6. Further, FIG. 8 is a partial section view showing an example of a procedure of flip chip connection in assembling the semiconductor device shown in FIG. 1 and FIG. 9 is a partial section view showing an example of a procedure of ball mounting in assembling the semiconductor device shown in FIG. 1. Further, FIG. 10 is a partial section view showing a forming method of a solder precoat in a first modified example of a wiring substrate used in assembling the semiconductor device shown in FIG. 1, FIG. 11 is a partial section view showing a forming method of a solder precoat in a second modified example of a wiring substrate used in assembling the semiconductor device shown in FIG. 1, and FIG. 12 is a partial section view showing a procedure of flip chip connection in a third modified example in assembling the semiconductor device shown in FIG. 1.

A semiconductor device in an embodiment shown in FIG. 1 and FIG. 2 is a semiconductor package in which a semiconductor chip 1 is solder-connected in flip chip packaging over a top surface 2a of a wiring substrate 2, and in the present embodiment, a BGA 9 will be described as an example of the semiconductor device, in which solder balls 5, which area plurality of external terminals, are provided to an undersurface 2b of the wiring substrate 2 in the form of a grid.

The detailed configuration of the BGA 9 will be described. The BGA 9 has the top surface 2a, a plurality of flip chip electrodes 2c shown in FIG. 5 formed in the top surface 2a, the wiring substrate (also referred to as a BGA substrate) 2 having the undersurface 2b on the opposite side of the top surface 2a and a plurality of lands 2j formed in the undersurface 2b, the semiconductor chip 1 which has a main surface 1a and a plurality of electrode pads 1c formed in the main surface 1a and which is flip-chip connected to the top surface 2a of the wiring substrate 2, and the solder balls 5, which are a plurality of external terminals provided to the lands 2j, respectively, of the undersurface 2b of the wiring substrate 2.

That is, in the BGA 9, the semiconductor chip 1 is flip-chip connected in a facedown packaging over the wiring substrate 2, and mounted over the wiring substrate 2 in the state where the main surface 1a of the semiconductor chip 1 and the top surface 2a of the wiring substrate 2 face each other. On this occasion, the semiconductor chip 1 is electrically coupled by solder connection to the wiring substrate 2 and flip-chip connected via a plurality of solder bumps 8.

The flip chip connection part located between the wiring substrate 2 and the semiconductor chip 1 and its periphery are filled with an underfill resin 6 that hardens and protects the flip chip connection part.

To the circumferential edge part of the top surface 2a of the wiring substrate 2, a stiffener ring 7 is attached in a state of surrounding the semiconductor chip 1. The stiffener ring 7 is adhered to the wiring substrate 2 by a ring-shaped tape 7a. On the top part of the stiffener ring 7, a heat spreader 4 is provided. The heat spreader 4 is joined to the stiffener ring 7 and to a backside 1b of the semiconductor chip 1 via a heat dissipating resin 13 over the semiconductor chip 1 and an adhesive material (for example, a tape material) 7b between the ring and the heat spreader 4.

Due to this, heat emitted from the semiconductor chip 1 is transferred to the heat spreader 4 via the heat dissipating resin 13 and dissipated to outside from the heat spreader 4 and at the same time, is transferred to amounting substrate from the solder ball 5 through the wiring substrate 2 via the solder bump 8. Further, the heat is transferred from the heat spreader 4 to the wiring substrate 2 via the adhesive material 7b and the stiffener ring 7 and is also transferred from the solder ball 5 to the mounting substrate via the wiring substrate 2 and dissipated.

As shown in FIG. 5, the wiring substrate 2 has a core layer 2h, which is a layer of a base material, buildup layers 2f formed over and below the core layer 2h, the flip chip electrodes 2c formed on the surface of the buildup layer 2f (top surface 2a of the wiring substrate 2), and the lands 2j formed on the backside of the buildup layer 2f (undersurface 2b of the wiring substrate 2).

Around the respective flip chip electrodes 2c and around the lands 2j, a solder resist film 2g, which is an insulating film, is formed.

As shown in FIG. 5, the flip chip electrode 2c on the side of the top surface 2a and the corresponding land 2j on the side of the undersurface 2b are electrically coupled via a through-hole wiring 2d formed in the core layer 2h, a via hole 2i formed in the buildup layer 2f, and an internal wiring 2e. A filling resin 2k is filled in the through-hole wiring 2d.

Here, the semiconductor chip 1 is formed from, for example, silicon, and further, the underfill resin 6 is, for example, an epoxy-based resin. The stiffener ring 7 and the heat spreader 4 are formed from a metal having high thermal conductivity and the flip-chip connected solder ball 8 and the solder ball 5, which is an external terminal, are formed from solder material, such as lead-free solder, for example, Sn—Ag—Cu based lead-free solder.

The flip chip electrode 2c, the via hole 2i, the internal wiring 2e, the through-hole wiring 2d, etc., in the wiring substrate 2 include, for example, pure copper or a copper alloy, which is copper to which a small amount (1% or less) of impurity, such as aluminum, silicon (Si), etc., is added.

In the BGA 9 in the present embodiment, on the respective surfaces of the flip chip electrodes 2c on the side of the top surface 2a of the wiring substrate 2 and on the respective surfaces of the lands 2j on the side of the undersurface 2b, no electroless plating, such as electroless Ni—Au plating, or no electrolytic plating is formed. That is, the solder bumps 8 are formed in the state where no electroless plating, such as electroless Ni—Au plating, or no electrolytic plating is formed on the respective surfaces of the flip chip electrodes 2c and on the other hand, the solder balls 5 are formed in the state where no electroless plating, such as electroless Ni—Au plating, or no electrolytic plating is formed also on the respective surfaces of the lands 2j.

Next, a method of manufacturing the BGA (semiconductor device) 9 in the present embodiment will be described along the assembling procedure shown in FIG. 3. The method of manufacturing the BGA 9 in the present embodiment is a method of manufacturing the BGA 9, in which the semiconductor chip 1 is solder-connected facedown on the side of the top surface 2a of the wiring substrate 2 having the top surface 2a and the undersurface 2b on the opposite side thereof, and which has the solder ball 5 connectable to the mounting substrate on the side of the undersurface 2b of the wiring substrate 2.

First, substrate preparation in step S1 shown in FIG. 3 is performed. Here, the wiring substrate (also referred to as a BGA substrate, a package substrate, etc.) 2 shown in FIG. 4 and FIG. 5 is prepared. As shown in FIG. 5, in the wiring substrate 2, solder bumps 2m are connected to the flip chip electrodes 2c of the top surface 2a thereof, respectively, and solder precoats 3 are formed on the lands 2j of the undersurface 2b, respectively.

Here, the forming method of the solder bump 2m on the side of the top surface 2a and the solder precoat 3 on the side of the undersurface 2b will be described using FIG. 6 and FIG. 7.

First, opening formation shown in step S11 in FIG. 6 is performed. Here, openings are formed in the solder resist film 2g that covers the flip chip electrodes 2c on the side of the top surface 2a, respectively, and at the same time, openings are formed in the solder resist film 2g that covers the lands 2j on the side of the undersurface 2b, respectively. These openings are formed by processing, for example, photo etching etc. Due to this, the flip chip electrodes 2c are exposed on the side of the top surface 2a of the wiring substrate 2 and at the same time, the lands 2j are exposed on the side of the undersurface 2b.

The flip chip electrodes 2c and the lands 2j include, for example, pure copper or an copper alloy, which is copper to which a small amount (1% or less) of impurity, such as aluminum, silicon (Si), etc., is added, and it may also be possible to perform Sn plating or anti-corrosion processing. By performing the Sn plating or anti-corrosion processing, it is possible to prevent the flip chip electrode 2c and the land 2j from being oxidized.

After that, solder paste printing/solder paste printing shown in step S12 in FIG. 6 is performed. Here, the respective flip chip electrodes 2c are applied with solder paste 2n by printing and further, the respective lands 2j are applied with solder paste 3a by printing. As shown in the solder paste printing in step S12 in FIG. 7, at the time of printing the solder paste 3a to each of the lands 2j, openings 10a in a solder printing mask 10 are arranged so as to align with the lands 2j and printing is performed so that the solder paste 3a is filled in the opening 10a. On this occasion, it is preferable to use a mask in which the size of the opening 10a in the solder printing mask 10 is smaller than that of the land 2j so as to prevent the height of the solder precoat 3 to be formed from becoming too high.

After that, as shown in step S13 in FIG. 6 and in step S13 in FIG. 7, reflow/flux cleaning is performed. Here, each solder paste 2n and each solder paste 3a are melted by reflow and the solder bump 2m is formed over each flip chip electrode 2c and at the same time, the solder precoat 3 is formed on each land 2j. In each land 2j, the opening in the solder resist film 2g is wide, and therefore, when the solder paste 3a melts by reflow, the shape turns into a shape with R and this forms the solder precoat 3. That is, by the mutual heat diffusion of the land 2j including pure copper or a copper alloy, which is copper to which a small amount (1% or less) of impurity, such as aluminum, silicon (Si), etc., is added, and the solder, a Sn—Cu based or Sn—Ag—Cu based alloy layer is formed in each land 2j.

When the solder precoat 3 is formed on each land 2j, the solder precoat 3 is formed so as to recess in its thickness direction from the solder resist film 2g that covers the circumferential edge part of the land 2j.

Due to this, in the subsequent flip chip connection step, it is possible to prevent the solder precoat 3 from coming into contact with a second head member when the second head member adsorbs and supports the wiring substrate 2, and it is also possible to prevent the stains of another solder precoat 3 from sticking to the surface of the solder precoat 3 as well as preventing the second head member from being stained, and therefore, it is possible to suppress the quality of the BGA 9 from deteriorating.

In this way, the solder bump 2m is formed to each flip chip electrode 2c of the wiring substrate 2 and at the same time, the solder precoat 3 is formed on each land 2j. After the reflow, reflux cleaning is performed.

After that, flip chip connection in step S2 in FIG. 3 is performed. That is, as shown in FIG. 8, the semiconductor chip 1 is mounted over the wiring substrate 2 by flip chip connection. Here, the semiconductor chip 1 is solder-connected facedown to the top surface 2a of the wiring substrate 2.

First, the wiring substrate 2 is prepared, in which the solder precoat 3 is formed on the surface of the lands 2j including pure copper or a copper alloy, which is copper to which a small amount (1% or less) of impurity, such as aluminum, silicon (Si), etc., is added, on the side of the undersurface 2b of the wiring substrate 2.

On the other hand, the semiconductor chip 1 is prepared, in which solder bumps 1d are connected to the electrode pads 1c (refer to FIG. 2) of the main surface 1a, and the backside 1b of the semiconductor chip 1 is adsorbed in a vacuum by a chip-side head 11, which is a first head member. Because a heating means (for example, a heater etc.) is provided to the chip-side head 11, the semiconductor chip 1 is heated by the chip-side head 11 in the state of being adsorbed in a vacuum as shown in chip heating in step S21 in FIG. 8. The heating temperature on this occasion is, for example, about 200 to 350° C.

The solder bumps 1d connected to the electrode pads 1c (refer to FIG. 2) of the main surface 1a of the semiconductor chip 1 are, for example, the solder bump 1d including Sn—Ag—Cu. Further, in the heat processing step (the cure step of the underfill resin 6, the bake step after the heat spreader 4 is attached, etc.) after the flip chip connection also, the solder precoat 3 is provided on the land 2j of the undersurface 2b of the wiring substrate 2, and therefore, the land 2j is suppressed from being oxidized.

After that, substrate heating shown in step S22 in FIG. 8 is performed. Here, the undersurface 2b of the wiring substrate 2 is supported by vacuum adsorption by a substrate-side head 12 (also referred to as a heat stage or heat block), which is the second head member. Because, a heating means (for example, a heater etc.) is provided also to the substrate-side head 12, the wiring substrate 2 is heated by the substrate-side head 12 in the state of being adsorbed in a vacuum. The heating temperature on this occasion is, for example, about 150 to 250° C.

In this state (state where the top surface 2a of the wiring substrate 2 adsorbed in a vacuum by the substrate-side head 12 and the main surface 1a of the semiconductor chip 1 adsorbed in a vacuum by the chip-side head 11 face each other), flip chip connection in step S23 in FIG. 8 is performed. When flip chip connection is performed, the solder precoat 3 is formed on the surface of the lands 2j including pure copper or a copper alloy, which is copper to which a small amount (1% or less) of impurity, such as aluminum, silicon (Si), etc., is added, on the side of the undersurface 2b of the wiring substrate 2. It is preferable for the solder precoat 3 to be lead-free solder, for example, Sn—Cu based solder.

By employing Sn—Cu based lead-free solder as the solder precoat 3 formed on the surface of the land 2j, it is possible to make the solder precoat 3 harder to melt even if thermal hysteresis affects the solder precoat 3 in the step of heat treatment, such as flip chip connection, compared to, for example, a 63Sn37Pb based eutectic solder coat.

Further, it is necessary to form the solder precoat 3 so as to have a height that prevents the solder precoat 3 from projecting from the solder resist film 2g when the solder precoat 3 is melted by reflow. Because the solder precoat 3 is formed so as to have a height that prevents the solder precoat 3 from projecting from the solder resist film 2g when the precoat 3 is melted, it is possible to prevent foreign matter of solder of the solder precoat 3 from sticking to the substrate-side head 12 and prevent the substrate-side head 12 from being stained.

Since the solder precoat 3 is formed on the surface of the lands 2j of the undersurface 2b of the wiring substrate 2, it is possible to avoid the state where the solder ball 5 does not stick to the land 2j in the step of forming a solder ball because the land 2j is oxidized when the thermal hysteresis affects the land 2j at the time of flip chip connection. That is, due to the formation of the solder precoat 3 on the surface of each land 2j, it is possible to connect the solder ball 5 to the land 2j in the subsequent step of forming a solder ball.

At the time of flip chip connection, the temperature (for example, 200 to 350° C.) when heating the semiconductor chip 1 by the chip-side head 11 is higher than the temperature (for example, 150 to 250° C.) when heating the wiring substrate 2 by the substrate-side head 12.

As described above, by setting the heating temperature by the substrate-side head 12 lower than that by the chip-side head 11, the thermal stress applied to the wiring substrate 2 can be reduced and it is possible to reduce the damage applied to the wiring substrate 2.

At the time of flip chip connection, in the state where the wiring substrate 2 is adsorbed in a vacuum over the heated substrate-side head 12, the semiconductor chip 1 adsorbed in a vacuum by the heated chip-side head 11 is pressed from the side of the backside 1b (from above) and thus flip chip connection is performed. Due to this, it is possible to perform flip chip connection of the solder bumps 1d provided to the semiconductor chip 1 and the solder bumps 2m connected to the flip chip electrode 2c of the wiring substrate 2 in the state where the coplanarity of both the bumps is aligned.

As a result of that, it is possible to improve connection reliability of the flip chip connection part.

Further, by employing Sn—Cu based lead-free solder as the solder precoat 3 also when heating the wiring substrate 2 at the time of flip chip connection, the solder precoat 3 is hard to melt even when the thermal hysteresis affects the solder precoat 3 at the time of flip chip connection.

Due to this, it is possible to suppress the occurrence of foreign matter of solder from the solder precoat 3 and to suppress foreign matter of solder from sticking to the substrate-side head 12. As a result of that, it is possible to suppress foreign matter of solder from sticking to the wiring substrate 2 to be conveyed later and at the same time, to suppress the flatness of the wiring substrate 2 and the adsorptivity of the substrate-side head 12 from deteriorating.

By the above, as shown in step S23 in FIG. 8, the solder bumps 1*d* over the semiconductor chip 1 and the solder bumps 2*m* over the wiring substrate 2 corresponding thereto are connected, respectively, and thus the flip chip connection is completed.

After the flip chip connection is completed, underfill injection shown in step S3 in FIG. 3 is performed. Here, the underfill resin 6 is filled between the wiring substrate 2 and the semiconductor chip 1 and at the same time, the underfill resin 6 is applied around the side surface of the semiconductor chip 1. Due to this, the underfill resin 6 is arranged around the flip chip connection part and the flip chip connection part is protected. After the filling of the underfill resin 6 is completed, the cure processing of the underfill resin 6 is performed.

After that, heat spreader mounting shown in step S4 in FIG. 3 is performed. First, as shown in FIG. 2, the stiffener ring 7 is pasted to the circumferential edge part of the top surface 2*a* of the wiring substrate 2 via the ring-shaped tape 7*a* so as to surround the semiconductor chip 1. Then, a heat dissipating resin 13 is applied to the backside 1*b* of the semiconductor chip 1 and the heat spreader 4 is attached over the semiconductor chip 1 via the heat dissipating resin 13. The stiffener ring 7 and the heat spreader 4 are attached to each other via the adhesive material (for example, a tape material) 7*b*. That is, the heat spreader 4 is in contact with both the semiconductor chip 1 and the stiffener ring 7 via the heat dissipating resin 13 and the adhesive material 7*b*, respectively, and as a result of that, the semiconductor chip 1 is brought into a state of being covered with the stiffener ring 7 and the heat spreader 4 over the top surface 2*a* of the wiring substrate 2.

After the arrangement of the heat spreader 4, bake processing of the heat dissipating resin 13 is performed and the attachment of the heat spreader 4 is completed.

As the solder bump 1*d* and the solder bump 2*m* of the flip chip connection part, lead-free solder including Sn—Ag—Cu etc. is employed and as the solder precoat 3 on the land 2*j* of the undersurface 2*b* of the wiring substrate 2, Sn—Cu based lead-free solder is employed.

After that, ball mounting shown in step S5 in FIG. 3 is performed. That is, the solder balls 5, which are external terminals, are electrically coupled to the lands 2*j* of the wiring substrate 2 by heating the solder precoat 3 on the land 2*j* of the undersurface 2*b* of the wiring substrate 2.

First, as shown in step S31 in FIG. 9, solder paste 5*a* is printed on the solder precoat 3 on each land 2*j* of the wiring substrate 2. It may also be possible to apply flux instead of the solder paste 5*a*. After that, ball attachment shown in step S32 is performed. Here, the solder ball 5 is temporarily fixed on the solder paste 5*a*. After that, reflow/cleaning shown in step S33 is performed. First, the solder ball 5 and the solder paste 5*a* are heated and melted by reflow. After that, by performing cleaning, the electrical connection of the solder ball 5 to the lands 2*j* by solder connection is completed.

Solder used as the solder ball 5 is, for example, 63Sn37Pb etc., in the case of lead-containing solder, and on the other hand, in the case of lead-free solder, for example, it is Sn3Ag0.5Cu etc.

Due to the employment of lead-free solder including Sn—Ag—Cu etc. as the solder bump 1*d* and the solder bump 2*m* of the flip chip connection part and the employment of Sn—Cu based lead-free solder as the solder precoat 3 on the land 2*j* of the undersurface 2*b* of the wiring substrate 2, the solder bump 1*d*, the solder bump 2*m*, and the solder precoat 3 are hard to melt because of their high melting points, similarly as described above, even if the thermal hysteresis at the time of the solder ball 5 connection affects them.

As described above, the assembling of the BGA 9 shown in FIG. 1 and FIG. 2 is completed.

In the method of manufacturing a semiconductor device in the present embodiment, when the semiconductor chip 1 is solder-connected by flip chip connection, the solder precoat 3 is formed on the surface of the land 2*j* on the side of the undersurface 2*b* of the wiring substrate 2, and therefore, the connection between the land 2*j* and the solder ball 5, which is an external terminal, is solder-connected and thus it is possible to improve the impact resistance of the connection part between the land 2*j* and the solder ball 5. That is, P (phosphorus) contained in, for example, electroless NiAu plating, is no longer included in the connection part between the land 2*j* and the solder ball 5, and therefore, it is possible to prevent the occurrence of micro voids in a P (phosphorus)-rich layer and it is possible to improve the impact resistance of the connection part between the land 2*j* and the solder ball 5.

Because of the above, it is possible to aim at improvement of reliability of the BGA 9.

When the solder precoat 3 is not formed on the surface of the lands 2*j* of the wiring substrate 2, the pure copper or the copper alloy, which is copper to which a small amount (1% or less) of impurity, such as aluminum, silicon (Si), etc., is added, of the land 2*j* is exposed, and therefore, there is a possibility that the surface of the land 2*j* is oxidized and the solder ball 5 cannot be connected in the ball mounting step because there are steps in which various kinds of thermal hysteresis affect before the ball mounting step, however, in the assembling of the BGA 9 in the present embodiment, the solder precoat 3 is formed on the surface of the land 2*j*, and therefore, it is possible to suppress the surface of the land 2*j* from being oxidized and to connect the solder ball 5 to the land 2*j* in the ball mounting step.

Further, also at the connection of the flip chip electrode 2*c* of the wiring substrate 2 and the solder bump 1*d* of the semiconductor chip 1 for which flip chip connection is performed, the solder connection can be performed without interposing Ni—Au plating etc., and therefore, it is possible to improve the impact resistance of the connection part between the flip chip electrode 2*c* and the solder bump 1*d*.

Further, because electrolytic plating is not used, it is not necessary to provide a plating lead in the wiring substrate 2, and therefore, it is possible to prevent the signal quality of the transfer path from deteriorating due to the plating lead as well as increasing the degree of freedom in wiring design.

Since the solder precoat 3 formed on the surface of the land 2*j* of the wiring substrate 2 is lead-free solder, the melting point of lead-free solder is high, and therefore, the solder precoat 3 is hard to melt even when the thermal hysteresis affects the solder precoat 3 in the bake processing, cure processing, etc. It is unlikely that the substrate-side head 12 (stage) at the time of flip chip connection is stained and it is possible to maintain the quality of the BGA 9.

Further, by employing Sn—Cu based solder, which is lead-free solder, as the solder precoat 3, it is possible to increase the connection strength of the solder ball 5 whether the solder ball 5, which is connected as an external terminal, is eutectic (lead-containing) solder or lead-free solder. As a result of that, it is made possible to treat both the eutectic (lead-containing) solder and lead-free solder, and therefore, it is possible to make common the wiring substrate 2. Due to this, it is possible to aim at the reduction in the cost of the wiring substrate 2 and the cost of the BGA 9.

As an alternative technique of the solder precoat 3, electroless Ni—Pd—Au plating can be conceived of, however, it is difficult to manage a plating liquid and film thickness/quality and the surface technique capable of treating both the eutectic (lead-containing) solder and the lead-free solder is not yet established, and therefore, the solder precoat technique with which a solder precoat can be manufactured easily as in the present embodiment is effective.

Next, modified examples of the present embodiment will be described.

In a first modified example shown in FIG. 10, a ball mounting method is employed, in which a solder ball 2p is mounted instead of the solder paste 2n when the solder bump 2m is formed to the flip chip electrode 2c for which flip chip connection of the wiring substrate 2 is performed.

First, opening formation shown in step S41 in FIG. 10 is performed. That is, openings are formed in the solder resist film 2g on the side of the top surface 2a of the wiring substrate 2 and in the solder resist film 2g on the side of the undersurface 2b, respectively, and the flip chip electrodes 2c on the side of the top surface 2a and the lands 2j on the side of the undersurface 2b are exposed.

After that, solder paste printing/solder ball mounting shown in step S42 in FIG. 10 are performed. The solder paste 2n may be flux. First, on the side of the top surface 2a of the wiring substrate 2, the solder paste 2n is applied to the flip chip electrodes 2c by printing, respectively, and after the application, the solder ball 2p is mounted (arranged) over each solder paste 2n. On the other hand, on the side of the undersurface 2b of the wiring substrate 2, the solder paste 3a is applied to the lands 2j by printing, respectively. The solder paste 3a may be flux.

After that, reflow/flux cleaning is performed as shown in step S43 in FIG. 10. Here, the solder paste 2n, the solder ball 2p, and the solder paste 3a are melted by reflow, respectively, and then the solder bump 2m is formed on each flip chip electrode 2c and at the same time, the solder precoat 3 is formed on the surface of each land 2j. In each land 2j, the opening in the solder resist film 2g is wide, and therefore, when the solder paste 3a is melted by reflow, the shape is turned into a shape with R and thus the solder precoat 3 is formed. That is, by the mutual heat diffusion of the land 2j including pure copper or a copper alloy, which is copper to which a small amount (1% or less) of impurity, such as aluminum, silicon (Si), etc., is added, and the solder, an Sn—Su based alloy layer is formed in each land 2j.

When the solder precoat 3 is formed on each land 2j, the solder precoat 3 is formed so as to recess in its thickness direction from the solder resist film 2g that covers the circumferential edge part of the land 2j.

After reflow, flux cleaning is performed and after flux cleaning, flip chip connection is performed.

As described above, by using the ball mounting method in which the solder ball 2p is mounted for formation of the bump (ball) connection part (solder bump 2m), it is possible to aim at the stabilization of connection quality with a narrow pitch and a number of bumps, and therefore, to aim at the stabilization of the quality of the BGA (semiconductor device) 9 of flip chip connection type.

Further, by using the ball mounting method at the flip chip connection part, it is possible to make uniform the heights of the balls, and therefore, to improve the coplanarity of the semiconductor chip 1. Further, the sagging problem in printing a paste is solved and the bumps can be formed high with uniform height.

Next, in a second modified example shown in FIG. 11, bumps are formed over the semiconductor chip 1 using the same ball mounting method as the ball mounting method over the wiring substrate 2. That is, even in the case of a combination of ball mounting on the side of the chip and printing on the side of the substrate, the coplanarity of bumps is improved and the junction stabilization can be aimed at.

In more detail, first, solder ball mounting shown in step S51 in FIG. 11 is performed. Here, the solder bumps (solder ball) 1d are provided on the main surface 1a of the semiconductor chip 1 by the ball mounting method.

After that, reflow shown in step S52 in FIG. 11 is performed. That is, reflow is performed at temperatures exceeding the melting point of the bump and due to this, flip chip connection shown in step S53 in FIG. 11 is performed.

The combination may be one of ball mounting on both the side of the chip and the side of the substrate.

After that, as shown in step S31 in FIG. 9, the solder paste 5a is printed over the solder precoat 3 of each land 2j of the wiring substrate 2. Flux may be applied instead of the solder paste 5a. Further, ball attachment shown in step S32 is performed. Here, the solder ball 5 is temporarily fixed on the solder paste 5a.

After that, reflow/cleaning shown in step S33 is performed. First, the solder ball 5 and the solder paste 5a are heated and melted by reflow. After that, cleaning is performed and thus electrical connection by solder connection of the lands 2j to the solder balls 5 is completed.

In the manner described above, it is possible to aim at the stabilization of connection quality with a narrow pitch and a number of bumps also in the second modified example and to aim at the stabilization of the quality of the BGA (semiconductor device) 9 of flip chip connection type. Further, it is possible to make uniform the heights of the balls and the coplanarity of the semiconductor chip 1 can be improved.

Next, a third modified example shown in FIG. 12 shows a modified example of a flip chip connection method. First, bump temporal fixing shown in step S61 in FIG. 12 is performed. Here, flux 1e is transferred to the solder bumps 1d provided on the main surface 1a of the semiconductor chip 1 and after the transfer, the wiring substrate 2 in the state where solder bumps 2q coined by fluttering etc. are connected to the respective flip chip electrodes 2c and the semiconductor chip 1 are flip-chip connected. On this occasion, first the solder bumps 2q connected to the respective flip chip electrodes 2c of the wiring substrate 2 and the solder bumps 1d of the semiconductor chip 1 are temporarily fixed.

After that, reflow shown in step S62 in FIG. 12 is performed. That is, reflow is performed at temperatures exceeding the melting point of the bump and thereby flip chip connection shown in step S63 in FIG. 12 is performed.

On this occasion, there is a case where a gap part between the wiring substrate 2 and the semiconductor chip 1 is cleaned to remove flux, however, it may also be possible to omit cleaning by using flux that does not need cleaning or removing flux by plasma processing etc.

As described above, it may also be possible to perform flip chip connection by a method in which the semiconductor chip 1 or the wiring substrate 2 is not pressed by a head member, and in this case, the solder precoat 3 is formed on the surface of the land 2j on the side of the undersurface 2b of the wiring substrate 2, and therefore, it is possible to prevent the land 2j from being oxidized.

As described above, the invention made by the inventors of the present invention is explained specifically based on the embodiments, however, it is needless to say that the present invention is not limited to the embodiments of the present invention and there can be various modifications in the scope not deviating from its gist.

For example, in the embodiments described above, as an example of the semiconductor device, the BGA 9 to which the stiffener ring 7 is attached is taken and explained, however, the stiffener ring 7 may not be provided. In such a case, the heat spreader 4 is jointed only to the backside 1b of the semiconductor chip 1 via the heat dissipating resin 13 etc.

The present invention is suitable for an electronic device of flip chip connection type.

What is claimed is:

1. A method of manufacturing a semiconductor device comprising the steps of:
    (a) providing a wiring substrate having a top surface and an under surface opposite to the top surface, the wiring substrate having first lands and second lands on the top and under surfaces respectively, the first and second lands are each formed of a copper layer;
    (b) mounting a semiconductor chip on the top surface of the wiring substrate such that the semiconductor chip is connected to the first lands via first lead-free solder bumps formed between the wiring substrate and the semiconductor chip in a face-down manner at a first heat treatment higher than a melting point of the first lead-free solder bumps; and
    (c) after step (b), connecting second lead-free solder bumps to the second lands of the wiring substrate, wherein the first heat treatment in step (b) is performed under a condition such that a solder pre-coat layer is formed on each of the second lands of the wiring substrate, thereby preventing the second lands from oxidation due to the first heat treatment.

2. The method of manufacturing a semiconductor device according to claim 1, wherein
    the solder pre-coat is lead-free solder.

3. The method of manufacturing a semiconductor device according to claim 2, wherein
    the lead-free solder is Sn—Cu based solder or Sn—Ag—Cu based solder.

4. The method of manufacturing a semiconductor device according to claim 3, further comprising the step of
    during step (b), applying heat to the solder pre-coat to electrically couple the solder bumps to the second lands of the wiring substrate.

5. The method of manufacturing a semiconductor device according to claim 1, comprising the step of
    before step (b), forming the solder pre-coat on a plurality of lands on a side of the under surface of the wiring substrate, wherein
    the solder pre-coat is recessed in its thickness direction from an insulating film that covers a circumferential edge part of the land to which the solder pre-coat is connected.

6. The method of manufacturing a semiconductor device according to claim 5, wherein
    in step (b), when the semiconductor chip is connected to the wiring substrate by a solder connection, a backside of the semiconductor chip is heated by a first head member and further, the under surface of the wiring substrate is heated by a second head member; and
    a temperature when the semiconductor chip is heated by the first head member is higher than a temperature when the wiring substrate is heated by the second head member.

7. The method of manufacturing a semiconductor device according to claim 6, wherein
    when the semiconductor chip is connected to the wiring substrate by the solder connection in step (b), the semiconductor chip is heated by the first head member in a state where the semiconductor chip is adsorbed in vacuum and further, the wiring substrate is heated by the second head member in a state where the wiring substrate is adsorbed in vacuum.

8. The method of manufacturing a semiconductor device according to claim 7, wherein
    when the semiconductor chip is connected to the wiring substrate by the solder connection in step (b), a plurality of solder bumps including Sn—Ag—Cu is provided on a main surface of the semiconductor chip.

9. The method of manufacturing a semiconductor device according to claim 1, wherein
    in step (b), when the semiconductor chip is connected to the wiring substrate by a solder connection, solder bumps are arranged respectively to a plurality of flip chip electrodes on a side of the top surface of the wiring substrate and after the arrangement, the solder bumps are melted by reflow.

10. The method of manufacturing a semiconductor device according to claim 9, wherein
    in step (b), when the semiconductor chip is connected to the wiring substrate by the solder connection, solder paste is applied to each of a plurality of the lands on a side of the under surface of the wiring substrate and after the application, the solder bump and the solder paste are melted by the reflow.

11. The method of manufacturing a semiconductor device according to claim 9, wherein
    in step (b), when the semiconductor chip is connected to the wiring substrate by the solder connection, solder bumps for the solder pre-coat are arranged respectively to a plurality of the lands on the side of the under surface of the wiring substrate and after the arrangement, the solder bumps and the solder bumps for solder pre-coat are melted by the reflow, and thus the solder pre-coat is formed on the surface of the lands.

12. The method of manufacturing a semiconductor device according to claim 1, wherein
    when the semiconductor chip is connected to the wiring substrate by the solder connection in step (b), solder bumps respectively joined to electrode pads of the semiconductor chip by a ball mounting method are provided.

* * * * *